US006948138B1

(12) United States Patent
Shen

(10) Patent No.: US 6,948,138 B1
(45) Date of Patent: Sep. 20, 2005

(54) METHOD FOR POSITIONING I/O BUFFERS AND PADS IN AN IC LAYOUT

(75) Inventor: Zhaoxuan Shen, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 204 days.

(21) Appl. No.: 10/288,692

(22) Filed: Nov. 4, 2002

(51) Int. Cl.[7] .............................. G06F 17/50; G06F 9/45
(52) U.S. Cl. ................... 716/2; 716/9; 716/10
(58) Field of Search ............................... 716/1–4, 7–14

(56) References Cited

U.S. PATENT DOCUMENTS

| | | | | |
|---|---|---|---|---|
| 5,513,119 A | * | 4/1996 | Moore et al. | 716/8 |
| 5,946,477 A | * | 8/1999 | Ito | 716/9 |
| 6,367,051 B1 | * | 4/2002 | Pileggi et al. | 716/2 |
| 6,367,060 B1 | * | 4/2002 | Cheng et al. | 716/10 |
| 6,681,373 B1 | * | 1/2004 | Zolotykh et al. | 716/2 |
| 6,701,505 B1 | * | 3/2004 | Srinivasan | 716/10 |
| 6,701,506 B1 | * | 3/2004 | Srinivasan et al. | 716/10 |
| 6,732,343 B2 | * | 5/2004 | Frerichs et al. | 716/10 |
| 6,754,877 B1 | * | 6/2004 | Srinivasan | 716/2 |
| 2002/0184607 A1 | * | 12/2002 | Alpert et al. | 716/15 |

OTHER PUBLICATIONS

C. H. Papadimitriou et al., "Combinatorial Optimization: Algorithms and Complexity," published in 1982 by Prentice–Hall, Inc., Englewood Cliffs, NJ.*

* cited by examiner

Primary Examiner—Leigh M. Garbowski
(74) Attorney, Agent, or Firm—Daniel J. Bedell; Smith-Hill and Bedell

(57) ABSTRACT

A method for use by a placement and routing tool automatically selects positions for all n I/O buffers of an IC from among a set of m available legal positions for such buffers within an IC layout so as to best meet a set of criteria affected by I/O buffer placement. The method initially establishes a weighted cost function $c_{i,j}$ quantifying a cost, relative to that set of criteria, of assigning the $i^{th}$ I/O buffer to the $j^{th}$ legal position. The weighted cost function is then evaluated with respect to each possible combination of i and j to produce an m×n cost data matrix indicating all costs associated with all of the m×n possible I/O buffer placements. The cost data matrix is then analyzed to produce a placement plan assigning each I/O buffer to a separate legal position in a way that minimizes a total cost of the buffer placement with respect to the set of criteria. The method may also be used to assign I/O pads among a set of legal pad positions.

15 Claims, 3 Drawing Sheets

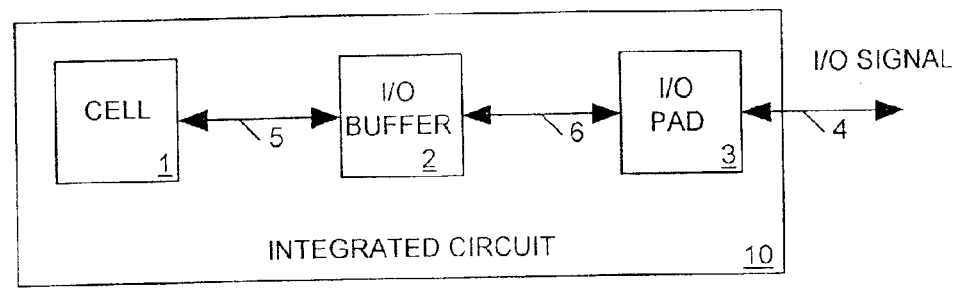
FIG. 1
(PRIOR ART)
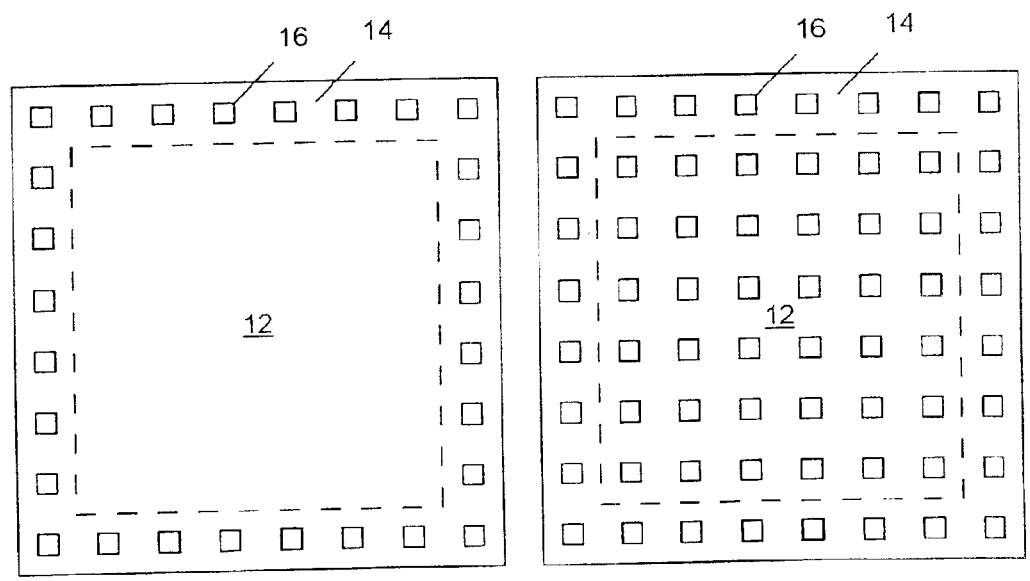
FIG. 2
(PRIOR ART)
FIG. 3
(PRIOR ART)

METHOD FOR POSITIONING I/O BUFFERS AND PADS IN AN IC LAYOUT

BACKGROUND OF THE INVENTION

1. Field of the Invention

The present invention relates in general to systems for generating integrated circuit (IC) layouts, and in particular to a method for determining where to position input/output (I/O) buffers and pads within an IC layout.

2. Description of Related Art

An IC designer typically employs synthesis tools to produce an IC design in the form of a gate level netlist referencing cells (circuit components) to be included in the IC and indicating which terminals of those cells are to be interconnected by nets (signal paths). The netlist also indicates which cell terminals are to transmit and receive the IC's input/output (I/O) signals. A cell library describes each kind of cell that may be included in the IC design, and the netlist indicates the nature of each cell by referencing an entry in the cell library for that particular type of cell.

While the netlist references cells to be included in the IC and indicates which of their terminals are to be interconnected, it does not indicate where each cell is to be placed or how it is to be oriented in a semiconductor and does not indicate how the nets interconnecting the cell terminals are to be routed. Therefore, after producing a gate level netlist, the IC designer typically employs a placement and routing (P&R) tool to produce a placement plan indicating how each cell referenced by the netlist is to be positioned and oriented in an IC layout, and to produce a routing plan indicating how the nets are to be routed between cell terminals. The P&R tool also designs the signal paths that are to link some of the cell terminals to I/O pads on the surface of the IC that are to act as the IC's points of connection to external circuits. The signal paths between the cells and the I/o pads not only include conductors, but also include I/O buying each of the IC's I/O signals.

FIG. 1 illustrates in block diagram form a circuit cell 1 formed within an IC 10 that may transmit an I/O signal to or receive an I/O signal from an external circuit via an I/O buffer 2, an I/O pad 3, and an external signal path 4 leading to the external circuit. Exposed on the upper surface of the IC 10, the conductive I/O pad 3 acts as a point of connection for signal path 4. External signal path 4 may include, for example, a conductive bond wire, a solder ball or a spring contact bonded to or contacting pad 3. Signal paths 5 and 6, formed by conductors and vias residing on and between conductive layers of the IC above the substrate, interconnect cell 1, I/O buffer 2 and I/O pad 3. I/O buffer 2 amplifies the unidirectional or bidirectional I/O signal passing between cell 1 and I/O pad 3.

FIG. 2 is a simplified plan view of a conventional layout for an IC 10 having a semiconductor substrate including a core area 12 containing the circuit cells and a peripheral area 14 surrounding the core area containing the I/O buffers. The IC's I/O pads typically reside above peripheral area 14. A grid of power and ground lines (not shown) usually delivers power to all of the cells forming the IC, and the cells are positioned within core area 12 in rows extending along the power and ground grid lines. Since the I/O buffers are typically larger and have greater power requirements than other cells of an IC, separate power and ground lines are provided in peripheral area 14 to deliver power to the I/O buffers. Each I/O buffer typically may occupy only a limited set of "legal positions" 16 along the power and ground lines within peripheral area 14. The I/O pads reside above the I/O buffers at the same set of legal positions 16.

As chip integration density and complexity within core area 12 continue to increase, the number of IC I/O signals have increased to the point where in many cases there are an insufficient number of legal positions in the peripheral area 14 of an IC to accommodate all of the IC's I/O buffers and pads. In accordance with more recently developed "area I/O buffer" technology as illustrated in FIG. 3, power and ground grids for supplying I/O buffers extend over the entire IC so that I/O buffers and pads may be placed in a large number of legal positions 16 distributed in a regular array over the entire IC 10 including core area 12 and peripheral area 14.

The IC designer usually selects a legal position 16 for each I/O pad of the IC. When a P&R tool generates the placement and routing plan for an IC, it first prepares a placement plan specifying positions of all cells that are to reside in core area 12, and then prepares a routing plan describing the nets that are to interconnect terminals of those cells. The P&R tool may adapt the placement and routing plans to provide an appropriate I/O buffer at each legal position 16 that the designer has indicated is to be occupied by an I/O pad, and to provide signal paths interconnecting the I/O buffers and pads to the cells that communicate though them.

Referring to FIGS. 1 and 3, in many cases it may be advantageous to assign an I/O buffer 2 and the I/O pad 3 to which it is be linked via conductor 6 to different legal positions 16. For example when the distance between cell 1 and I/O pad 3 is relatively large, positioning I/O buffer 2 at some legal position 16 between cell 1 and the legal position of I/O pad 3 may be required to reduce signal attenuation in signal path 5 to an acceptable level or to reduce the signal path delay between cell 1 and pad 3 to an acceptable level. The designer may also establish other criteria for the layout that could be affected by I/O buffer placement. For example the designer may want all I/O buffers amplifying high frequency I/O signals or handling I/O signals of a particular voltage to be restricted to particular areas of the IC regardless of the positions of the I/O pads to which they are connected.

Since the choice of legal position 16 for each I/O buffer can impact the ability of an IC to satisfy a set of criteria that are affected by I/O buffer position, what is needed is a computationally efficient method that a P&R tool may employ to determine how to assign each I/O buffer or pad to a legal position 16 in a way that optimally satisfies that set of criteria.

BRIEF SUMMARY OF THE INVENTION

In accordance with a preferred embodiment of the invention as described in detail below, an I/O buffer placement method selects positions for all n I/O buffers of an IC from among a set of m available legal positions for such buffers within an IC layout so as to best satisfy a set of p criteria affected by I/O buffer placement, where p is an integer greater than 0.

The method initially establishes a weighted cost function $$c_{i,j} = \sum_k a_k * b_{k,i,j}$$

quantifying a "cost" of assigning the $i^{th}$ I/O buffer to the $j^{th}$ legal position where ak is a constant weighting factor associated with a $k^{th}$ criterion and where $b_{k,i,j}$ is a measure of a cost with respect to the $k^{th}$ criterion of assigning the $i^{th}$ I/O buffer to the $j^{th}$ available position.

The weighted cost function $c_{ij}$ is then evaluated with respect to each possible combination of i and j to produce an m×n cost data matrix indicating all costs associated with all of the m×n possible I/O buffer placements.

The cost data matrix is then processed, for example by a conventional weighted bipartite or non-bipartite graph matching algorithm, to produce a placement plan assigning each I/O buffer to a separate legal position in a way that minimizes a total cost $$\text{COST} = \sum_{i,j} x_{i,j} * c_{i,j}$$

of the buffer placement with respect to the set of criteria. In the above expression $x_{i,j}=j^{th}$ when the placement plan assigns the $i^{th}$ I/O buffer to the $j^{th}$ legal position, and $x_{i,j}=0$ when the placement plan does not assign the $i^{th}$ I/O buffer to the $j^{th}$ legal position.

In an alternative embodiment of the invention, a similar method is used to assign an IC's I/O pads to legal positions in an optimal manner relative to criteria affected by I/O pad placement.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWINGS

FIG. 1 is a block diagram depicting a cell incorporated into an integrated circuit (IC) and other structures internal and external to the IC through which the cell communicates with an external circuit in accordance with prior art;

FIGS. 2 and 3 are simplified plan views of an IC illustrating legal positions at which I/O buffers and I/O pads may be placed in accordance with prior art;

DETAILED DESCRIPTION OF THE INVENTION

Figures 4, 5:
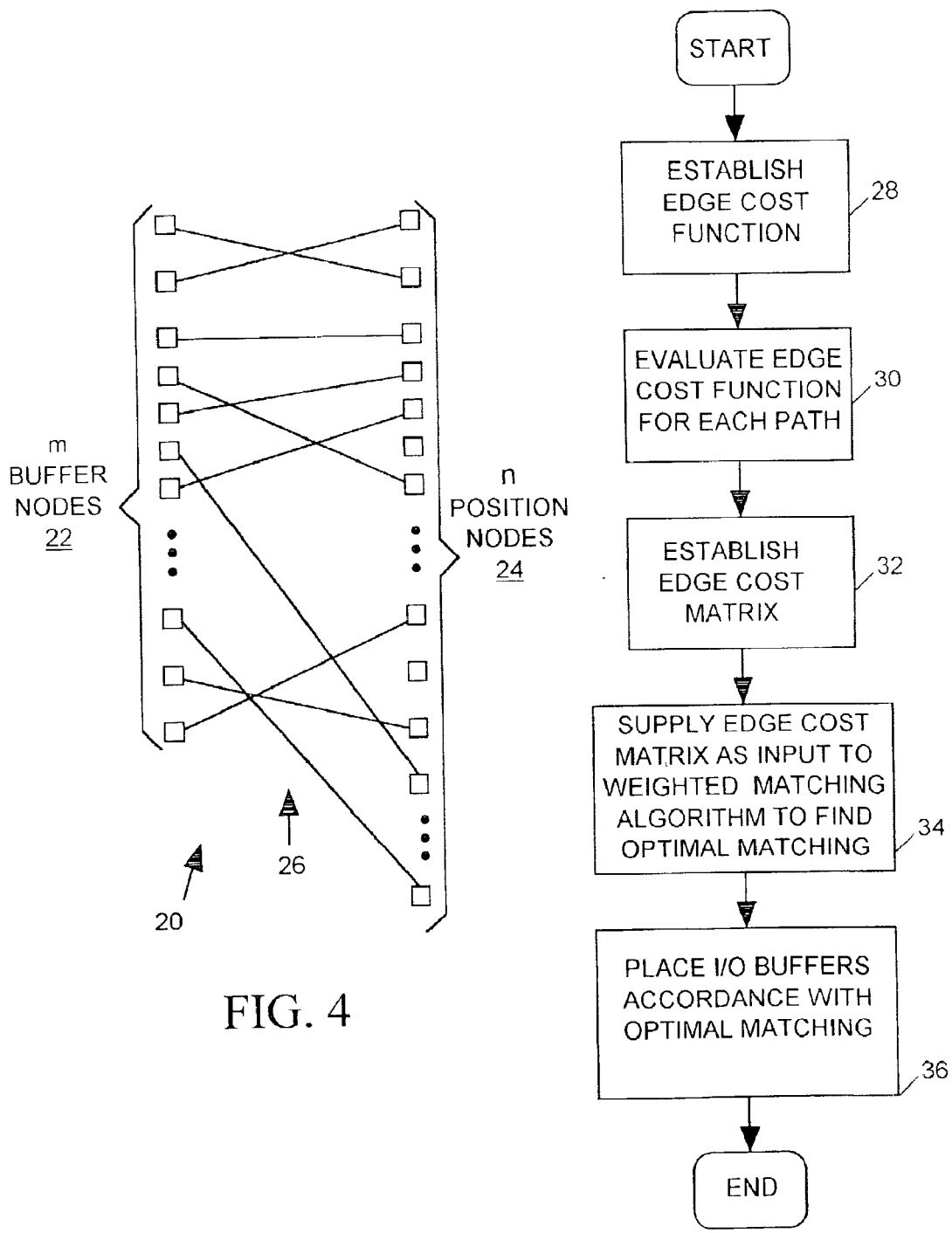
FIG. 4 is a graph representing an I/O buffer placement plan produced in accordance with the invention.
FIG. 5 is a flow chart representing a method for assigning I/O buffers to legal positions in accordance with the invention.

While this specification describes an exemplary embodiment and application of the invention considered by the applicant to be a best mode of practicing the invention, those of skill in the art will appreciate that other modes of practicing the invention are possible. Therefore it is not intended that the invention be limited to the exemplary embodiment or to the application described below. The claim(s) amended to this specification define the true scope of the invention.

The invention can be provided as an improvement to a conventional placement and routing (P&R) tool for automatically designing an integrated circuit (IC) layout is usually implemented in the form of software stored on computer readable media which when read and executed by a conventional computer, causes the computer to act as a P&R tool. Typical computer-readable media upon which P&R tool software can be provided include but are not limited to compact disks, floppy disks, hard disks, and random access or read only memory.

A typical IC includes cells for communicating with external circuits through input and output (I/O) signals entering and leaving the IC through I/O pads formed on the topmost surface of the IC. A P&R tool usually adds a set of I/O buffers to an IC layout for amplifying signals passing between the I/O pads and the cells that communicate with the external circuits. For example, FIG. 1 shows one such I/O buffer 2 for amplifying an I/O signal passing between a IC cell 1 and an I/O pad 3 linked to an external circuit through an external signal path 4. Signal paths 5 and 6 within IC 10 interconnect cell 1, I/O buffer 2 and I/O pad 3.

Conventional P&R tools automatically determine how to position, orient and interconnect all cells of an IC described by a netlist, and may also automatically add and position I/O buffers within the IC as needed to buffer signals passing between the IC's cells and I/O pads. As illustrated in FIGS. 2 and 3, a P&R tool positions the cells forming an IC in a core area 12 of the IC and positions the I/o pads and I/O buffers at any of a set of "legal positions" 16 which may appear only a peripheral area 14 of the IC (FIG. 2) or which may be distributed over the entire surface of the IC as illustrated in FIG. 3. Not all available legal positions 16 may be occupied by I/O pads and buffers.

An IC designer will typically tell a P&R tool which legal position 16 each I/O pad is to occupy based on known interface specifications for the IC. After the P&R tool generates a placement plan establishing a position for each cell forming the IC, the P&R tool incorporates a separate I/O buffer into the IC design for each I/O pad and routes the signal paths interconnecting the pad to the I/O buffer and the I/o buffer to a terminal of cell in the core area. In doing so, the P&R tool assigns each I/o buffer to a separate one of legal positions 16.

Referring to FIGS. 1 and 3, various criteria for the IC layout may make it beneficial or necessary for a P&R tool to assign an I/O buffer 2 and the I/O pad 3 to which it is linked to different legal positions 16. For example positioning I/O buffer 2 closer to cell 1 than I/O pad 3 may help to reduce signal path delays as necessary to satisfy timing constraints that may have been placed on signal paths 5 and 6 or may help reduce signal attenuation in signal path 5 to an acceptable level. The designer may want the P&R tool to try to minimize the number of vias (signal paths between IC layers) needed to interconnect cells, I/O buffers and I/O pads. The designer may also want the P&R tool to enforce various other criteria relative to I/O buffer placement, for example, requiring that all I/O buffers handing high frequency signals or signals of a particular voltage to be restricted to particular areas of the IC regardless of the positions of the I/O pads to which they are connected.

Accordingly, a best mode of practicing the present invention as described herein relates to a computationally efficient method a P&R tool may employ for choosing a legal position 16 for each I/O buffer when the legal positions of their corresponding I/O pads have been predetermined. The method, suitably implemented in the form of subroutines incorporated into otherwise conventional P&R tool software stored on computer readable media, is capable of assigning I/O buffers to legal positions 16 in a manner that best satisfies any set of criteria imposed on the IC layout that may be affected by I/O buffer placement.

As illustrated in FIG. 4, an IC's I/O buffers and legal positions can be represented as nodes of a graph 20 with the I/O buffers being represented by "buffer nodes" 22 on one side of the graph and legal positions 16 being represented by "position nodes" 24 on the other side of the graph. An edge 26 connecting one of buffer nodes 22 to one of legal position nodes 24 represents a "matching" whereby a particular I/o buffer represented by that buffer node 22 is assigned to the particular legal position represented by that position node 24. When edges 26 connect each I/O buffer node 22 to a separate one of legal position nodes 24, graph 20 represents a placement plan for the IC's I/O buffers. When there are m buffer nodes 22 and n position nodes 24, each of the m buffer nodes 22 must be matched to any one of the n different legal position nodes 24. Therefore to produce a buffer placement plan, the P&R tool must select m edges 26 from among a total of m×n possible edges 26 in order to match each of the m buffer nodes 22 to a separate one of position nodes 24.

Each of the m×n possible edges 26 the P&R tool may select represents a buffer position assignment that imposes a particular "cost" with respect to any set of criteria the placement plan may affect. Thus we can think of the objective of the P&R tool as being to select the particular set of m edges 26 that will minimize the total cost of the placement plan with respect to that set of criteria.

FIG. 5 illustrates a method in accordance with the invention that a P&R tool can employ to match each I/O buffer node 22 with a separate one of legal position nodes 24 to produce an I/O buffer placement plan arranged to optimally satisfy criteria influenced by I/O buffer placement. The first step of the method (step 28) is to establish a cost function $c_{i,j}$, that can be evaluated to quantify the cost of each of the possible edges 26 with respect to the set of criteria affected by buffer placement. When the criteria are identified by separate values of integer k, then the cost function $c_{i,j}$ established at step 28 quantifies a cost of providing an edge 26 between the $i^{th}$ buffer node 22 and the $j^{th}$ position node 24 as a weighted sum of costs associated with each criterion, $$c_{i,j} = \sum_k a_k * b_{k,i,j}$$

where $a_k$ is a constant weighting factor associated with criteria k, and $b_{k,i,j}$ is a quantity associated with criterion k that can vary with i and j. For example (referring to FIG. 1) if criterion k=1 is the length, attenuation or path delay of signal path 5 between cell 1 and I/O buffer 2, then variable $b_{1,i,j}$ would be the estimated length, attenuation or path delay of signal path 5 when buffer i is placed at position j. If criterion k=2 is the length, attenuation or path delay of signal path 6 between cell I/O buffer 2 and I/O pad 3, then variable $b_{2,i,j}$ would be the estimated length, attenuation or path delay of signal path 6 when buffer i is placed at position j.

The total cost of any particular placement plan for the I/O buffers is therefore the sum of costs of all of the m edges 26 the P&R tool selects for inclusion in the graph representing that placement plan:

$$COST = \sum_{i,j} x_{i,j} * c_{i,j}$$

where $x_{i,j}=1$ when the placement plan employs an edge linking the $i^{th}$ buffer node 22 to the $j^{th}$ legal position 24, and where $x_{i,j}=0$ when the placement plan does not employ that edge. The object of the P&R tool is to select the set of edges that match each of m buffer nodes 22 with a separate legal position node 24 in a manner that minimizes the above total cost function.

Figures 6, 7, 8:
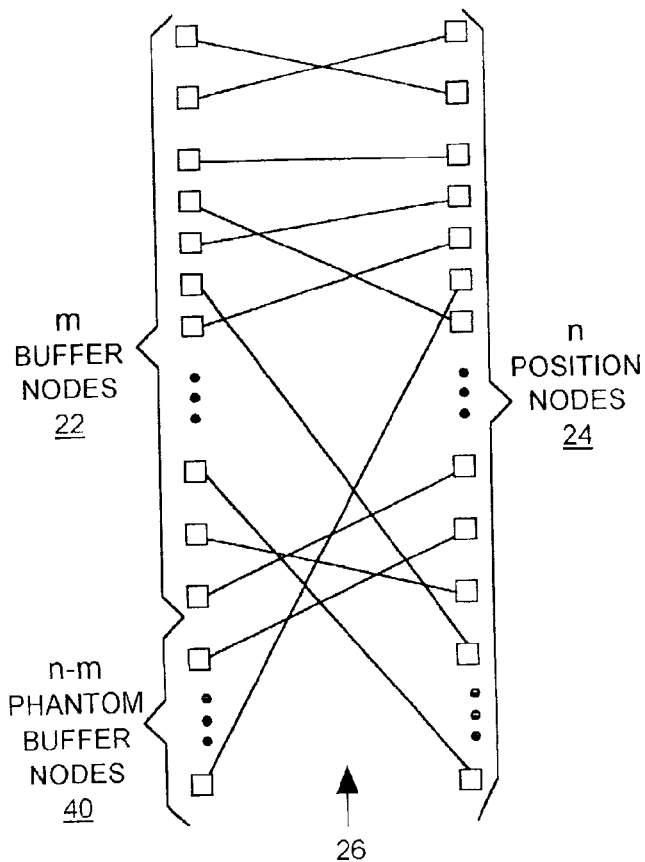
FIG. 6 illustrates a cost data matrix generated by the method of FIG. 5.
FIG. 7 is a bi-partite version of the graph of FIG. 4.
FIG. 8 illustrates a modified version of the cost data matrix of FIG. 6.

For example assume that a circuit designer wants to minimize the average lengths of the signal paths 5 and 6 (FIG. 1) linking I/O buffers to cells and to I/O pads, to minimize the number of vias in those signal paths, and to connect buffers handling high frequency signals to I/O pads residing in a particular area of the IC. The P&R tool thus establishes a cost function $c_{i,j}$ at step 28 as follows:

$$C_{i,j}=a_1*b_{1,i,j}+a_2*b_{2,i,j}+a_3*b_{3,i,j}$$

where $b_{1,i,j}$ is the signal path lengths associated with a matching of buffer node 22 with legal position 24, $b_{2,i,j}$ is the number of vias associated with that matching, and $b_{3,i,j}$ has value 0 when the matching links a high frequency buffer i to an I/O pad j that is within the desired high frequency area of the IC and otherwise has value 1. At step 28, the IC designer provides the P&R tool with a separate weighting factor, $a_k$ for each of the k criteria, the designer setting the values of weighting factors $a_1$, $a_2$ and $a_3$ in proportion to the relative importance of each criteria. For example it if is essential that high frequency buffers be linked only to pads in the area reserved for high frequency operation, then weighting factor $a_3$ can be made very large in relation to the other weighting factors to ensure that the cost of connecting a high frequency buffer to a pad outside that area or of connecting a low frequency pad to a buffer inside that area is so high that a placement plan placing a high frequency I/O buffer outside that area is unlikely to minimize the cost function. The path cost function $c_{i,j}$ for each possible matching is then evaluated (step 30), and the results of the cost evaluations for all possible edges are organized into a two-dimensional m×n data array (or "cost data matrix") as illustrated in FIG. 6.

The placement and routing tool then employs a conventional weighted matching algorithm (step 34) to process the cost data matrix established at step 32 to provide an optimal matching by selecting the particular set of m edges that minimize total cost. Thereafter (step 36) the P&R tool configures the IC placement and routing plans such that the I/O buffers reside at the legal positions represented by the optimal matching determined at step 34.

The book "Combinatorial Optimization: Algorithms and Complexity, by Christos H. Papadimitriou and Kenneth Steiglitz, published in 1998 by Dover Publications is incorporated herein by reference. Pages 219–229 and 247–255 of that book describe a "weighted bipartite matching algorithm" that the P&R tool can employ at step 34 to determine the optimal matching that will minimize a cost function for a bipartite graph having the same number (n) of nodes on either side of the graph. The algorithm therefore operates on a square, n×n cost data matrix. Since the number n of legal positions for I/O buffers usually exceeds the required number m of I/O buffers, the m×n cost data matrix of FIG. 6 will usually not be square. However we can employ the bi-partite matching algorithm by first adding n–m I/O "phantom" buffer nodes 40 to graph 20 of FIG. 4 so that, as illustrated in FIG. 7, it becomes a bi-partite graph having a similar number n of buffer and position nodes. When the cost function $c_{i,j}$ is evaluated for each edge 26 at step 30 of FIG. 5, the cost function for edges 26 that terminate on phantom nodes 40 are set to 0 to indicate that there is no cost assisted with any of those edges. Thus the cost data matrix established at step 32 becomes an n×n cost data matrix having an additional n−m rows of 0's as illustrated in FIG. 8. With the cost of each edge 26 of the graph of FIG. 7 terminating on a phantom buffer node 40 set to 0, the total cost associated with any particular matching is influenced only by the costs of edges 26 terminating on the m real buffer nodes 22. Costs of edges 26 terminating on phantom nodes 40 therefore have no impact on the choice of optimal matching generated by the algorithm at step 34. When the P&R tool places I/O buffers at step 36 in accordance with the optimal matching, it places I/O buffers corresponding only to the m buffer nodes 22 of FIG. 4.

Pages 219–229 and 247–255 of the aforementioned book incorporated herein by reference describe a "weighted non-bipartite matching algorithm" that can be used at step 34 to determine an optimal matching minimizing the cost of the non-bipartite graph illustrated in FIG. 4 where the number n of legal position nodes 24 exceed the number m of buffer nodes 22. Since that algorithm can operate on a cost data matrix similar to that of FIG. 6 in which m and n are unequal, it is not necessary to first convert the m×n cost data matrix of FIG. 6 into the n×n cost data matrix of FIG. 8 before applying the weighted non-bipartite matching algorithm to the cost data matrix.

A method similar to that illustrated in FIG. 5 can be used to establish positions for an IC's I/O pads in a case where the legal position of each I/O buffer is predetermined and the P&R tool is given the freedom to select the legal position of each I/O pad in a manner that best satisfies a set of constants. In such case nodes 22 of FIG. 4 would represent I/O pads and nodes 24 would represent available legal positions for the I/O pads.

The foregoing specification and the drawings depict exemplary embodiments of the best mode(s) of practicing the invention, and elements or steps of the depicted best mode(s) exemplify the elements or steps of the invention as recited in the appended claims. However the appended-claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method for generating an integrated circuit (IC) layout comprising the steps of:
   a. establishing, for each possible combination of values of i and j, a cost function $c_{i,j}$ quantifying a cost, relative to a set of p criteria, of assigning an $i^{th}$ one of a set of m input/output (I/O) buffers to a $j^{th}$ one of a set of n available buffer positions within the IC layout, where m and n are integers greater than 1, p is an integer greater than 0, where i and j are integers greater than 1;
   b. establishing a total cost function that is a weighted sum of cost functions $c_{i,j}$ for all combinations of possible values of i and j;
   c. producing a buffer placement plan placing each I/O buffer in a separate one of the available buffer positions such that the total cost function has a minimum value.

2. The method in accordance with claim 1 wherein p is greater than 1.

3. The method in accordance with claim 1 wherein the cost function $c_{i,j}$, is:

$$c_{i,j} = \sum_k a_k * b_{k,i,j}$$

wherein $a_k$, is a weighting factor associated with a $k^{th}$ criterion of the set of p criteria and wherein $b_{k,i,j}$ is a measure of a cost with respect to criterion k of placing the $i^{th}$ one of the I/O buffers in the $j^{th}$ one of the available buffer positions.

4. The method in accordance with claim 3 wherein the buffer placement plan produced at step c minimizes the following cost function:

$$\text{COST} = \sum_{i,j} x_{i,j} * c_{i,j}$$

where $X_{i,j}=1$ when the buffer placement plan places the $i^{th}$ I/O buffer in the $j^{th}$ available buffer position, and where $x_{i,j}=0$ when the buffer placement plan does not place the $i^{th}$ I/O buffer in the $j^{th}$ available buffer position.

5. The method in accordance with claim 1 further comprising the step of:
   d. generating the IC layout wherein the IC layout indicates that the I/O buffers are placed in the available buffer positions in which they were placed by the buffer placement plan.

6. Computer readable media containing software which when read and executed by a computer causes the computer to carry out a method for assigning each of a set of m input/output (I/O) buffers to a separate one of a set of n available buffer positions within an integrated circuit (IC) layout, wherein the method comprises the steps of:
   a. establishing, for each possible combination of values of i and j, a cost function $c_{i,j}$ quantifying a cost, relative to a set of p criteria, of assigning an $i^{th}$ one of the set of m I/O buffers to a $j^{th}$ one of the set of n available buffer positions, where i and j are integers greater than 1, and p is an integer greater than 0;
   b. establishing a total cost function that is a weighted sum of cost functions $c_{i,j}$ for all combinations of possible values of i and j; and
   c. producing a buffer placement plan placing each I/O buffer in a separate one of the available buffer positions so as to minimize the total cost function.

7. The computer readable media in accordance with claim 6 wherein p is greater than 1.

8. The computer readable media in accordance with claim 6 wherein the cost function $c_{i,j}$ is:

$$c_{i,j} = \sum_k a_k * b_{k,i,j}$$

wherein $a_k$ is a weighting factor associated with a $k^{th}$ criterion of the set of p criteria and wherein $b_{k,i,j}$ is a measure of a cost with respect to criterion k of placing the $i^{th}$ one of the I/O buffers in the $j^{th}$ one of the available buffer positions.

9. The computer readable media in accordance with claim 8 wherein the buffer placement plan produced at step C minimizes the following cost function:

$$COST = \sum_{i,j} x_{i,j} * c_{i,j}$$

where $x_{i,j}$=1 when the buffer placement plan places the $i^{th}$ I/O buffer in the $j^{th}$ available buffer positions, and where $x_{i,j}$=0 when the buffer placement plan does not place the $i^{th}$ I/O buffer in the $j^{th}$ available buffer position.

10. The computer readable media in accordance with claim 9 wherein a weighted non-bipartite graph matching algorithm is employed at step c to analyze the cost data values and produce the buffer placement plan.

11. The computer readable media in accordance with claim 6 wherein the method further comprises the step of:
   d. generating the IC layout wherein the IC layout indicates that the I/O buffers are placed in the available buffer positions in which they were placed by the buffer placement plan.

12. A method for generating an integrated circuit (IC) layout comprising the steps of:
   a. establishing, for each possible combination of values of i and j, a cost function $c_{i,j}$ quantifying a cost, relative to a set of p criteria, of assigning an $i^{th}$ one of a set of m input/output (I/O) pads to a $j^{th}$ one of a set of n available pad positions within the IC layout, where i and j are integers greater than 1, where m and n are integers greater than 1, and p is an integer greater than 0;
   b. establishing a total cost function that is a weighted sum of cost functions $C_{i,j}$ for all combinations of possible values of i and j;
   c. producing a pad placement plan placing each I/O pad in a separate one of the available pad positions so as to minimize the total cost function; and
   d. generating the IC layout wherein the IC layout indicates that the I/O pads are placed in accordance with the pad placement plan.

13. The method in accordance with claim 12 wherein the cost function $c_{i,j}$ is;

$$c_{i,j} = \sum_{k} a_k * b_{k,i,j}$$

wherein $a_k$ is a weighting factor associated with a $k^{th}$ criterion of the set of p criteria,
   wherein $b_{k,i,j}$ is a measure of a cost with respect to criterion k of placing the $i^{th}$ one of the I/O pads in the $j^{th}$ one of the available pad positions,
   wherein the pad placement plan produced at step c minimizes the following cost function;

$$COST = \sum_{i,j} x_{i,j} * c_{i,j}$$

wherein $X_{i,j}$=1 when the buffer placement plan places the $i^{th}$ I/O buffer in the $j^{th}$ available buffer position, and
   wherein $X_{i,j}$=0 when the buffer placement plan does not place the $i^{th}$ I/O buffer in the $j^{th}$ available buffer position.

14. Computer readable media containing software which when read and executed by a computer causes the computer to carry out a method for assigning each of a set of m input/output (I/O) pads to a separate one of a set of n available pad positions within an integrated circuit (IC) layout, wherein the method comprises the steps of:
   a. establishing, for each possible combination of values of i and j, a cost function $c_{i,j}$ quantifying a cost, relative to a set of p criteria, of assigning an $i^{th}$ one of the set of m I/O pads to a $j^{th}$ one of the set of n available pad positions, where m and n are integers greater than 1, where i and j are integers greater than 1, and p is an integer greater than 0;
   b. establishing a total cost function that is a weighted sum of cost functions $C_{i,j}$ for all combinations of possible values of i and j; and
   c. producing a pad placement plan placing each I/O pad in a separate one of the available pad positions so as to minimize the total cost function.

15. The computer readable media in accordance with claim 14 wherein the cost function $c_{i,j}$ is:

$$c_{i,j} = \sum_{k} a_k * b_{k,i,j}$$

wherein $a_k$ is a weighting factor associated with a $k^{th}$ criterion of the set of p criteria,
   wherein $b_{k,\ i,j}$ is a measure of a cost with respect to criterion k of placing the $i^{th}$ one of the I/O pads in the $j^{th}$ one of the available pad positions,
   wherein the pad placement plan produced at step c minimizes the following cost function:

$$COST = \sum_{i,j} x_{i,j} * c_{i,j}$$

wherein $x_{i,j}$=1 when the buffer placement plan places the $i^{th}$ I/O buffer in the $j^{th}$ available buffer position, and
   wherein $x_{i,j}$=0 when the buffer placement plan does not place the $i^{th}$ I/O buffer in the $j^{th}$ available buffer position.

* * * * *